(12) United States Patent
Galli

(10) Patent No.: US 6,259,297 B1
(45) Date of Patent: Jul. 10, 2001

(54) PROTECTION CIRCUIT FOR POWER TRANSISTOR

(75) Inventor: Giovanni Galli, Messina (IT)

(73) Assignee: STMicroelectronics S.r.l., Milan (IT)

( * ) Notice: Subject to any disclaimer, the term of this patent is extended or adjusted under 35 U.S.C. 154(b) by 0 days.

(21) Appl. No.: 09/304,709

(22) Filed: May 4, 1999

(30) Foreign Application Priority Data

May 4, 1998 (IT) ............................................. MI98A0962

(51) Int. Cl.[7] .............................. H03K 5/08; H03L 5/00
(52) U.S. Cl. .............................. 327/320; 327/309; 361/56
(58) Field of Search ........................ 361/56, 91; 327/309, 327/513, 318–320, 325, 478, 327, 326; 330/261, 298

(56) References Cited

U.S. PATENT DOCUMENTS

| | | | |
|---|---|---|---|
| 4,276,442 | * 6/1981 | Iekana et al. | 361/88 |
| 4,712,153 | * 12/1987 | Marget et al. | 361/91 |
| 4,714,896 | * 12/1987 | Addis | 330/261 |
| 5,202,811 | * 4/1993 | Minks | 361/56 |
| 5,663,673 | * 9/1997 | Tanaka et al. | 327/318 |
| 5,986,832 | * 11/1999 | Barnett | 327/314 |

* cited by examiner

*Primary Examiner*—Terry D. Cunningham
*Assistant Examiner*—Long Nguyen
(74) *Attorney, Agent, or Firm*—Jenkens & Gilchrist, P.C.; Theodore E. Galanthay

(57) ABSTRACT

A protection circuit is disclosed for a bipolar power transistor for preventing the operating point thereof from leaving a useful operating area. The protection circuit includes a sense resistor connected between an input supply voltage and a collector of the bipolar power transistor; a first branch circuit, including a first diode connected to the collector of the bipolar power transistor and a first current source connected between a common output node and the first diode; a second branch circuit, including a second diode and a second current source connected between the second diode and the common output node; and a third branch circuit. A short-circuit current level of the bipolar power transistor at relatively low voltage levels of the input supply voltage is based upon current levels for the first current source and the second current source and a resistance value of the sense resistor connected to the bipolar power transistor. The protection circuit further includes a fourth circuit branch including a current mirror connected to the common output node and a third current source connected between the input supply voltage and the current mirror. A short-circuit current level of the bipolar power transistor at relatively high voltage levels of the input supply voltage is substantially equal to the current level of the third current source.

26 Claims, 3 Drawing Sheets

PROTECTION CIRCUIT FOR POWER TRANSISTOR

CROSS REFERENCE TO RELATED APPLICATION

The present application claims priority under 35 USC 119 from Italian Patent Application No. MI98A000962, filed May 4, 1998.

BACKGROUND OF THE INVENTION

1. Technical Field of Invention

The present invention relates to a protection circuit for a bipolar power transistor. More particularly, the invention relates to a protection method and circuit for preventing a bipolar power transistor from leaving an area of safe operation.

2. Background of the Invention

It is known that the safe operative region of active devices is limited by the maximum power that can be dissipated thereby and by voltage and current values which must not be exceeded if one does not wish to damage the active device.

In the case of a power transistor, the limits of safe operation are set by the maximum allowed values in terms of temperature, power dissipation, and voltage and current levels of the power transistor.

Exceeding the temperature limits can cause melting of the materials, dissociations or generation of reaction products which alter the characteristics of the transistor, deterioration of the technical characteristics and of the materials, and increased surface currents.

Taking into account these limits in terms of current, voltage and power, the useful region in which a bipolar power transistor can operate is generally the one shown in FIG. 1, which is a chart in which the axis of the abscissa plots the collector voltage and the axis of the ordinate plots the collector current of a bipolar power transistor.

The chart of FIG. 1 plots various curves which subtend useful operating regions having different areas according to the pulse duration applied to the base terminal of the power transistor being considered.

Outside the indicated useful region, if the current or power limits are exceeded the transistor is typically damaged or destroyed.

The natural positive feedback of a bipolar power transistor with respect to temperature can become critical when working at voltages higher than the ones at which a first breakdown of the bipolar power transistor occurs, i.e., when the current capacity of the device quickly decreases as the applied voltage rises.

Without a carefully designed protection circuit, the operating point of the bipolar power transistor can leave the above-indicated useful region unless a power transistor is used which is oversized with respect to the working points used.

Conventional circuits for protecting bipolar power transistors suffer some drawbacks. In particular, the known protection circuit shown in FIG. 2 (showing a simplified manner which nonetheless shows its key aspects) in which the power transistor is designated by the reference numeral 1, uses two current sources 4 and 5 and bipolar transistors 2 and 3. The protection circuit of FIG. 2, however, is unable to precisely set the short-circuit current Isc of the associated power transistor 1 because current source 5 tends to reach saturation.

There are other existing circuit configurations which tend to eliminate the positive feedback problems of the bipolar power transistor with respect to the temperature. In these circuits, as the temperature increases, the circuits respond by forcing a lower Isc current. These circuits, however, cannot be applied in a context which requires the options of eliminating current consumption with a power-off command and setting a constant current Isc for higher voltages, i.e., for voltages up to the maximum voltage considered by the technology of the device.

SUMMARY OF THE INVENTION

The aim of the present invention is to provide a protection circuit for a bipolar power transistor in which the area of useful operation of the power transistor can be utilized to the maximum extent, thereby allowing the device to operate up to its safety limit.

Within the scope of this aim, an object of the present invention is to provide a protection circuit for bipolar power transistors in which it is unnecessary to use a power transistor which is oversized with respect to the operating points used.

Another object of the present invention is to provide a protection circuit for bipolar power transistors in which it is possible to eliminate the current consumption of the device as well as the consumption of the protection circuit by employment of an external power-off command.

Still another object of the present invention is to provide a protection circuit for bipolar power transistors in which the short-circuit current thereof is set precisely without uncertainties due to saturations of bipolar transistors utilized in conventional protection circuits.

It is another object of the present invention to provide a regulator which uses a power transistor in conjunction with the above-described protection circuit.

Another object of the present invention is to provide a protection method and circuit for a bipolar power transistor which is highly reliable, relatively easy to provide and inexpensive to manufacture.

This aim, these objects and others which will become apparent hereinafter are achieved by a protection circuit for a bipolar power transistor for preventing the operating point of the transistor from leaving its area of useful operation. The protection circuit includes a current source which drives the base terminal of the power transistor. The collector terminal of the power transistor is connected to the input supply voltage via a sense resistor. The output of the power transistor is drawn from the emitter terminal thereof.

The present protection circuit includes a first circuit branch which is connected between the collector terminal of the power transistor and a common output node, including a first diode and a first current source. The first diode is connected to the collector terminal of the power transistor. In a preferred embodiment, the common output node coincides with the output of the power transistor.

The present protection circuit further includes a second circuit branch having a second diode and a second current source which is connected between the input supply voltage and the common output node.

A third circuit branch of the protection circuit is connected between the input supply voltage and the common output node, including a first pair of transistors which have common-connected emitter terminals and a second pair of transistors which are respectively series-connected to the transistors of the first pair of transistors. The emitter terminals of the second transistor pair are common-connected and the collector terminals thereof are respectively connected to the collector terminals of the transistors of the first pair of transistors. The transistors of the second pair of transistors are connected in a current mirror configuration.

A fourth circuit branch of the present protection circuit includes a plurality of series-connected diodes which are connected in series to a first resistor and in parallel to a second resistor. The fourth circuit branch includes a current mirror formed by a pair of transistors in which the respective emitter terminals thereof are connected to the common output node. The base terminals of the current mirror transistors are common-connected. The collector terminal of one of the current mirror transistors is connected to the first and second resistors of the fourth circuit branch, and the collector terminal of the other of the current mirror transistors is connected to a third current source.

The present protection circuit further includes a Zener diode which is connected between the first and fourth circuit branches, and a transistor which is connected between the base terminal of the power transistor and the common output node, having a base terminal which is connected to current mirror of the third circuit branch.

BRIEF DESCRIPTION OF THE DRAWINGS

Further characteristics and advantages of the present invention will become apparent from the following detailed description of a preferred but not exclusive embodiment of the circuit according to the invention, illustrated only by way of non-limitative example in the accompanying drawings, wherein.

DESCRIPTION OF THE PREFERRED EMBODIMENTS

Figure 1:
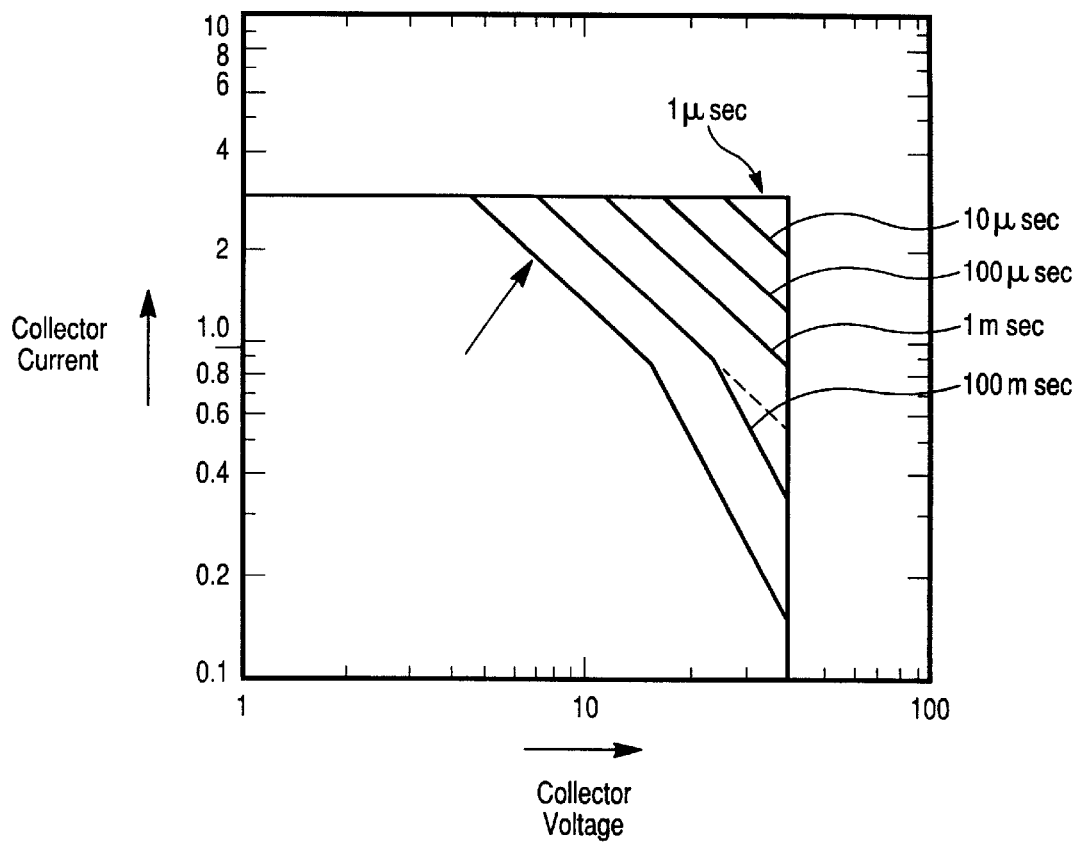
FIG. 1 is a chart which plots the useful operating area of a bipolar power transistor.
Figure 2:
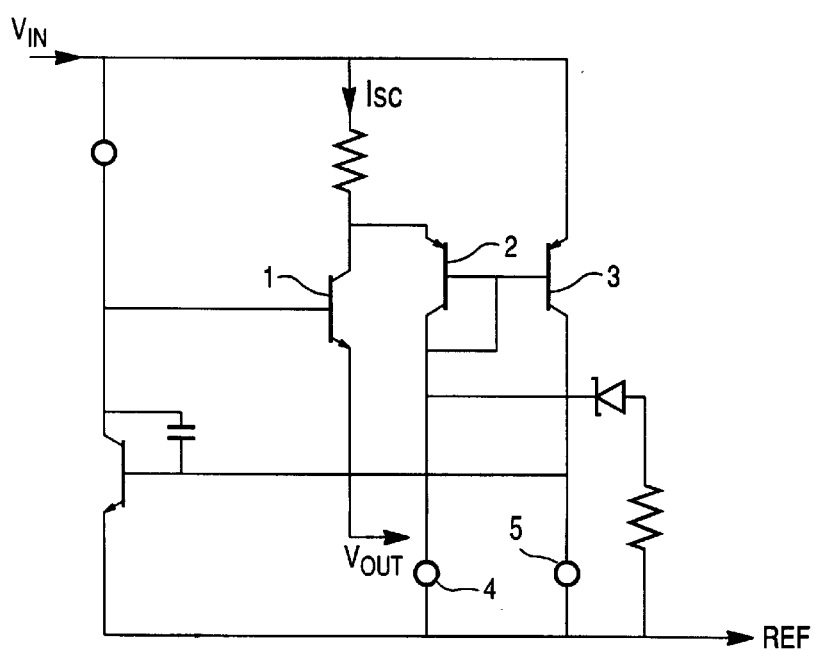
FIG. 2 is a circuit diagram of a conventional protection circuit for a bipolar power transistor.
Figure 3:
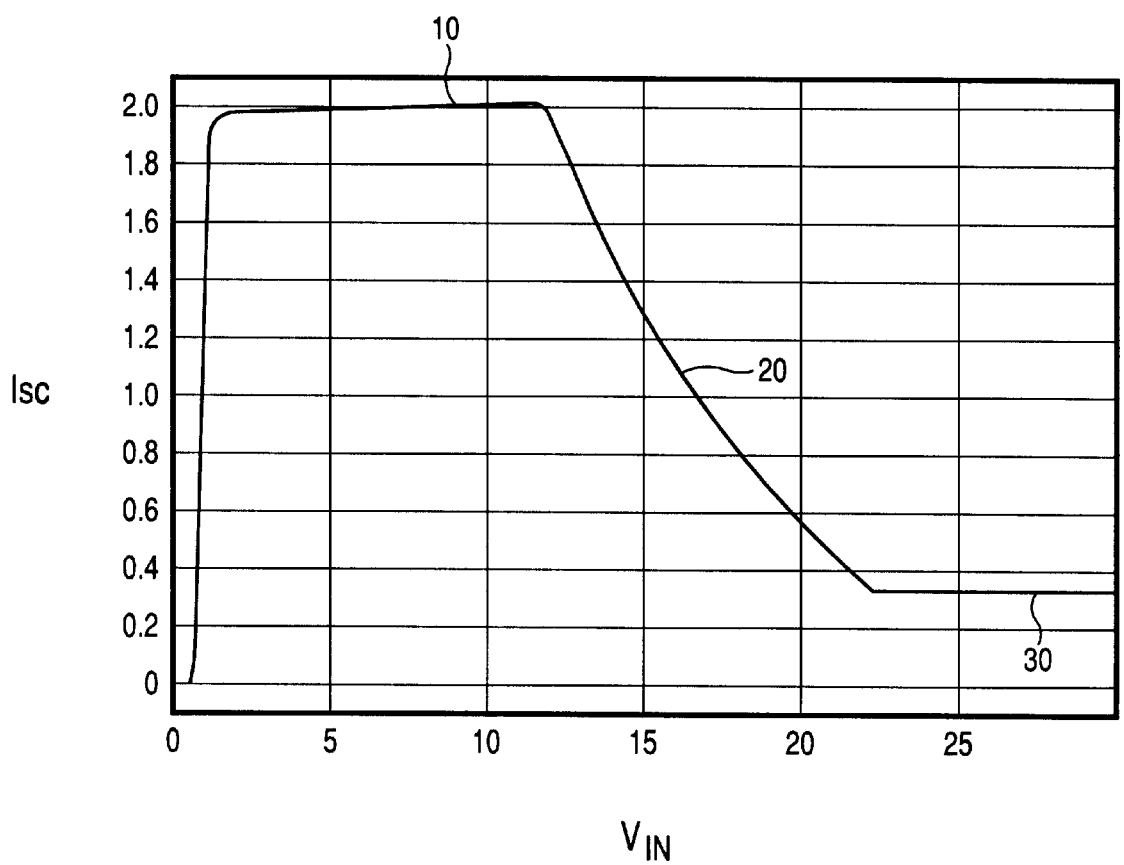
FIG. 3 is a chart of an i-v curve that defines the safe operating area of a power transistor to which the protection circuit according to the present invention is connected.
Figure 4:
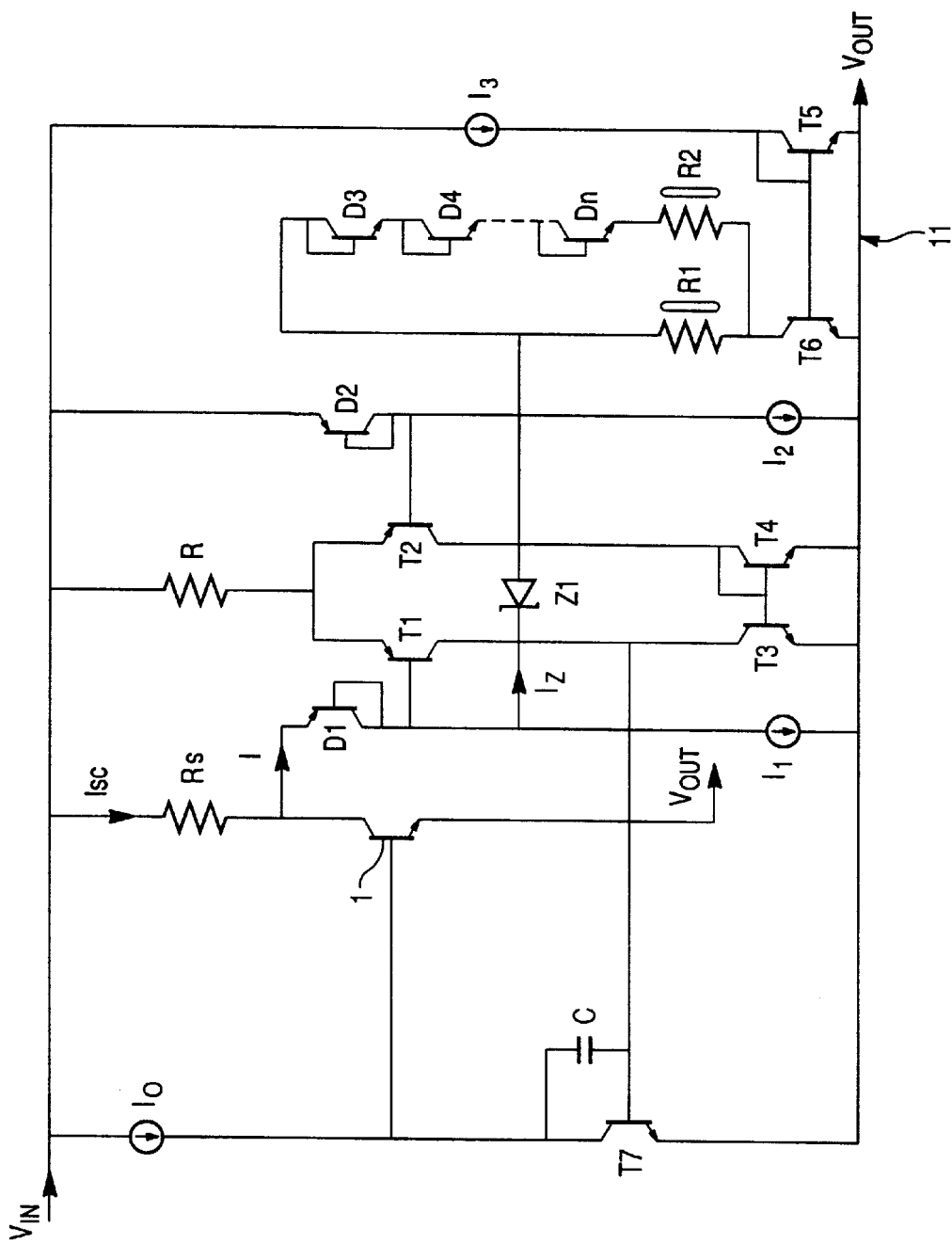
FIG. 4 is a circuit diagram of the protection circuit according to a preferred embodiment of the present invention.

With reference to FIGS. 3 and 4, the protection circuit for a bipolar power transistor according to a preferred embodiment of the present invention preferably has three operating ranges which can be distinguished by the voltage applied to the power transistor with an overload condition on its output.

The three regions of the protection circuit can be distinguished as a "low voltage" region 10 (FIG. 3) corresponding to input supply voltages which are lower than the voltage at which the first breakdown of the power transistor occurs; a "medium voltage" region 20 corresponding to input supply voltages which entail the occurrence of the first breakdown of the power transistor up to the occurrence of a second breakdown of the power transistor; and a "high voltage" region 30 corresponding to input supply voltages which are higher than the second breakdown of the power transistor up to the maximum voltage allowed by the technology of the device.

With reference to FIG. 4, the base of the power transistor 1 is driven by a current source Io (the network for biasing and possible preamplification thereof is omitted for the sake of simplicity).

The output voltage Vout of power transistor 1 is drawn from the emitter terminal thereof. A common output node 11 is tied to output Vout of power transistor 1. Consequently, common output node 11 will be hereinafter referred to as common output node Vout. A sense resistor Rs is connected between the collector terminal of power transistor 1 and the input supply voltage Vin.

A first circuit branch, constituted by a diode $D_1$ and by a current source $I_1$, is connected between the collector terminal of the power transistor 1 and the common output node Vout.

A second circuit branch, formed by a diode $D_2$ to which a current source $I_2$ is series-connected, is connected between the input supply voltage Vin and the common output node Vout, substantially in parallel with the first circuit branch.

A third circuit branch is formed by a first pair of transistors T1 and T2 and second pair of transistors T3 and T4. The emitter terminals of the transistors in each transistor pair are connected together. The collector terminals of the transistors T1 and T2 are connected to the collector terminals of the transistors T3 and T4, respectively.

The transistors T3 and T4 form a current mirror, with the emitters thereof being connected to the common output node Vout.

A resistor R is connected between the connected emitter terminals of the transistors T1 and T2 and the input supply voltage Vin.

The transistors T1 and T2 may preferably be bipolar PNP transistors, and the transistors T3 and T4 may preferably be bipolar NPN transistors.

The base of the transistor T2 is connected between the diode D2 and the current source $I_2$ of the second circuit branch. The base of transistor T1 is connected to diode D1 and current source I1. In this way, the first and second circuit branches bias the third circuit branch.

A preferred embodiment of the present invention includes a fourth circuit branch which modifies the quiescent operating point of the third circuit branch as the input voltage Vin is increased. The fourth circuit branch includes a plurality of series-connected diodes D3 to Dn, which are connected in series with a resistor R2. The series combination of diodes D3 to Dn and resistor R2 is connected in parallel relation to resistor R1.

The fourth circuit portion further includes a pair of transistors T5 and T6 which are connected in a current-mirror configuration, and a current source $I_3$ which is connected between the collector terminal of the transistor T5 and the input supply voltage Vin. The emitter terminals of the transistors T5 and T6 are connected to the common output node Vout. The collector terminal of transistor T6 is tied to resistors R1 and R2 of the fourth circuit branch.

A Zener diode Z1 connects the fourth circuit branch to the first circuit branch. A transistor T7 has a base terminal connected to the connected collector terminals of the transistors T1 and T3, a collector connected to the current source I0 and an emitter connected to the common output node Vout.

A capacitor C is connected between the collector terminal and the base terminal of the transistor T7.

The currents $I_1$, $I_2$ and $I_3$ are control currents which can be selectively turned off.

The operation of the protection circuit according to the present invention will be described with reference to FIG. 3.

The operation of the present invention will be described based upon a gradually increasing input supply voltage Vin being applied to the present protection circuit starting from the above-mentioned "low voltage" region 10. Input supply voltage Vin is further increased so that the present invention enters the above-mentioned "medium voltage" region 20 and still further increased until the present protection circuit reaches the "high voltage" region 30. In this description, the output of the power transistor 1 is in an overload condition (i.e., with Vout at ground potential, for example).

For voltages of input supply voltage Vin in the "low voltage" region 10, given the minimum bootstrap voltage of the protection circuit the control current sources $I_1$ and $I_2$ respectively set the voltages across the diodes $D_1$ and $D_2$. Consequently, in this region the voltage Vrs appearing across sense resistor Rs may be expressed in equation (A) as $$Vrs=Isc \cdot Rs=V_{D2}(I2)-V_{BE\_T2}+V_{BE\_T1}-V_{D1}(I) \quad (A)$$

where I is the current flowing into D1 and equals I1, $V_{D2}$ is the voltage appearing across diode D2, $V_{BE\_T2}$ is the base-to-emitter voltage for transistor T2, $V_{BE\_T1}$ is the base-to-emitter voltage for transistor T1, and $V_{D1}$ is the voltage appearing across diode D1.

By appropriately choosing the values of Rs, I1 and I2, it is possible to calibrate the short-circuit current Isc of power transistor 1 to the desired level that is constant as the input voltage Vin varies. The horizontal line segment 10 in FIG. 3 exemplifies the constant current level for Isc in the "low voltage" region 10.

The equation (A) is valid so long as the current $I_Z$ flowing through the Zener diode $Z_1$ is zero. In the "low voltage" region 10, input supply voltage Vin may be represented as $$Vin<V_{D1}+V_{Z1}+Vce_{sat\_T6} \quad (B)$$

wherein the term $V_{Z1}$ designates the voltage appearing across Zener diode $Z_1$, and the term $Vce_{sat\_T6}$ designates the collector-to-emitter saturation voltage of the transistor T6.

The choice of $V_{Z1}$, i.e., of the voltage detected across the Zener diode Z1, accordingly determines the extent, in terms of input voltage Vin, of the "low voltage" region 10. This choice corresponds to the first breakdown voltage of power transistor 1.

For the "medium voltage" region 20, as input voltage Vin is increased Vin may be represented as $$Vin>V_{D1}+V_{Z1}+Vce_{sat\_T6} \quad (C)$$

Under these conditions, the current $I_Z$ flowing through Zener diode Z1 is no longer zero. In this case, the current $I_Z$ may be expressed as $$Iz=(Vin-Isc \cdot Rs-V_{D1}-V_{z1}-Vce_{sat\_T6}) \cdot (1/R1+1/R2)-(V_{D3}/R2+V_{D4}/R2+\ldots+V_{Dn}/R2) \quad (*)$$

since $I=I1+I_Z$, substituting the equation for $I_Z$ into the equation (C) cited above shows that as the voltage Vin rises the short-circuit current Isc decreases.

Since the resistive layers normally used in integrated circuits are made of doped silicon, the resistivity thereof increases with increases in temperature, so that the first term of the second part of equation (*) alone would normally yield a current $I_Z$ which decreases according to the temperature and therefore a current Isc which increases according to the temperature. Accordingly, a degenerative phenomenon would occur on the bipolar power transistor 1 up to a hot spot in its operation.

For the present invention, however, the presence of the second term in equation (*), which is due to the presence of the n-3 diodes D3 to Dn, allows the current $I_Z$ to be calibrated according to the temperature with the chosen behavior, for example a substantially zero or positive temperature coefficient. In this manner, a current Isc is obtained with a substantially zero or negative temperature drift and therefore one obtains self-protection of the power transistor 1 and of the regulator that uses the power transistor.

For the "high voltage" region 30, as the input supply voltage Vin is further raised, a condition is reached in which $I_Z=I3$, so that the current $I_Z$ remains locked to the value I3 as does the current Isc by substituting $I=I1+I_Z=I1+I3$ in the first equation (C) cited above.

In this voltage range for input supply voltage Vin, the current I3 sets the value of Isc in that as Vin rises, the transistor T6 leaves its saturation region and the collector thereof follows the voltage Vin, so that the voltage across the fourth circuit branch remains constant.

The saturation of transistor T6 does not create problems since current source I3 is taken by the current mirror provided by the transistors T5 and T6.

It is understood that the consumption of the above-described protection stage can be eliminated using a power-off command by simply eliminating operation of the control currents I1, I2 and I3.

In particular, the condition I3=0 prevents the branch with the Zener diode $Z_1$ from absorbing current from the power supply, which is the typical cause of the higher current consumption in a voltage regulator having a power transistor provided which is operable in conjunction with a conventional protection circuit.

In general, the operating principle of the circuit according to the invention can be expressed by the following steps:

when the input supply voltage Vin is relatively low, determining current values for the current sources of the first and second circuit branches which are suitable to set a voltage across the transistors of the first and second circuit branches, and determining the value of the sense resistor Rs so as to keep constant the short-circuit current Isc of the power transistor 1 as the input supply voltage Vin varies;

as the input supply voltage rises, decreasing the short-circuit current by the fourth circuit branch;

as the temperature rises, decreasing the short-circuit current through the action of diodes D3 to Dn and the ratio between the first and second resistors of the fourth circuit branch; and when the input supply voltage is relatively high, setting the short-circuit current to the current level of the third current source.

In practice it has been found that the protection circuit according to the present invention allows optimum utilization of the operating area of the power transistor by preventing the operating point of the power transistor from leaving the operating area.

The protection circuit according to the present invention further allows for the elimination of current consumption of the regulator which uses the power transistor and the present protection circuit, by simply eliminating the control currents introduced therein.

In this manner it is possible in particular to eliminate the current consumption of the present protection circuit in the branch containing the Zener diode, which is the main cause of current absorption from the power supply.

The circuit thus described is susceptible of numerous modifications and variations, all of which are within the scope of the inventive concept. It is understood that the components of the present protection circuit may further be replaced with other technically equivalent elements.

In particular, the present protection circuit and corresponding power transistor can be used in a voltage regulator.

What is claimed is:

1. A protection circuit for a bipolar power transistor for preventing the operating point of the bipolar power transistor from leaving a useful operating area, the output of the bipolar power transistor being drawn from the emitter thereof, said protection circuit comprising:
   a current source which drives the base terminal of the bipolar power transistor;
   a sense resistor connected between an input supply voltage and the collector of said bipolar power transistor;
   a first circuit branch connected between the collector of said bipolar power transistor and a common output node, comprising a first diode and a first current source, said first diode being connected to the collector terminal of the bipolar power transistor, said common output node coinciding with the output of said bipolar power transistor;
   a second circuit branch connected between said input supply voltage and said common output node, including a second diode and a second current source;
   a third circuit branch, connected between said input supply voltage and said common output node, including a pair of emitter-coupled transistors having emitters which are connected to said input supply voltage via a resistor and bases which are connected to the first and second diodes, and a current mirror connected to the collectors of the pair of emitter-coupled transistors;
   a fourth circuit branch comprising a plurality of series-connected diodes connected in series to a first resistor and in parallel to a second resistor, a current mirror circuit connected to the first and second resistors, and a third current source connected to the current mirror;
   a Zener diode, which is connected between said first and fourth circuit branches; and
   a transistor connected between the base terminal of said bipolar power transistor and said common output node and having a base terminal which is connected to the current mirror of said third circuit branch.

2. The protection circuit according to claim 1, wherein said first current source, said second current source and said third current source are activated by a power-off command.

3. The protection circuit according to claim 1, wherein said Zener diode has the cathode terminal connected to the first circuit branch and the anode terminal connected to the fourth circuit branch.

4. The protection circuit according to claim 1, wherein the current mirror of the third circuit branch includes a pair of base-coupled transistors.

5. The protection circuit according to claim 1, wherein a short-circuit current level of said bipolar power transistor is based upon the number of said plurility of series-connected diodes of the fourth circuit branch.

6. The protection circuit according to claim 1, wherein the current mirror circuit of the fourth circuit branch includes a pair of base-coupled transistors, a collector terminal and a base terminal of one transistor of said pair of base-coupled transistors being connected together.

7. The protection circuit according to claim 1, further including a current source connected between the input supply voltage and said transistor.

8. The protection circuit according to claim 1, wherein:
   a short-circuit current level of said bipolar power transistor at relatively low voltage levels of said input supply voltage is based upon current levels for said first current source and said second current source and a resistance value of said sense resistor connected to said bipolar power transistor.

9. The protection circuit according to claim 1, wherein:
   a short-circuit current level of said bipolar power transistor at relatively low voltage levels of said input supply voltage is substantially constant.

10. The protection circuit according to claim 1, wherein:
    a short-circuit current level of said bipolar power transistor at relatively high voltage levels of said input supply voltage is based upon the current level of said third current source.

11. The protection circuit according to claim 10, wherein:
    the short-circuit current level of said bipolar power transistor at the relatively high voltage levels of said input supply voltage is substantially equal to the current level of said third current source.

12. The protection circuit according to claim 1, wherein:
    a short-circuit current level of said bipolar power transistor at relatively high voltage levels of said input supply voltage is substantially constant.

13. The protection circuit according to claim 1, wherein:
    a temperature drift of a short-circuit current of said bipolar power transistor is based upon said series-connected diodes in said fourth circuit branch.

14. The protection circuit according to claim 13, wherein:
    said short-circuit current of said bipolar power transistor has a non-positive temperature drift.

15. The protection circuit according to claim 1, wherein:
    current consumption in said protection circuit is substantially eliminated by eliminating current flow in said first, said second and said third current sources.

16. A circuit for protecting a bipolar power transistor, comprising:
    a sense resistor connected between an input supply voltage and a collector of the bipolar power transistor;
    a first branch circuit, including a first diode connected to the collector of the bipolar power transistor and a first current source connected between a common output node and the first diode;
    a second branch circuit, including a second diode connected to the input supply voltage and a second current source connected between the second diode and the common output node; and
    a third branch circuit, including a resistor connected to the input supply voltage, a current mirror and a pair of emitter-coupled transistors connected between the resistor and the current mirror;
    wherein a short-circuit current level of the bipolar power transistor at relatively low voltage levels of the input supply voltage is based upon current levels for the first current source and the second current source and a resistance value of the sense resistor connected to the bipolar power transistor.

17. The circuit of claim 16, wherein:
    the short-circuit current level of the bipolar power transistor at the relatively low voltage levels of the input supply voltage is substantially constant.

18. The circuit according to claim 16, further including:
    a fourth circuit branch including a current mirror connected to the common output node and a third current source connected between the input supply voltage and the current mirror.

19. The circuit according to claim 18, further including:
    a zener diode connected between the first diode and the fourth circuit branch.

20. The circuit according to claim 19, wherein:

a short-circuit current level of the bipolar power transistor at relatively high voltage levels of the input supply voltage is based upon the current level of the third current source.

21. The circuit according to claim 20, wherein:

a short-circuit current level of the bipolar power transistor at relatively high voltage levels of the input supply voltage is substantially equal to the current level of the third current source.

22. The circuit according to claim 19, wherein:

the fourth circuit branch further includes a diode string connected between the zener diode and the current mirror of the fourth branch circuit.

23. The circuit according to claim 22, wherein:

temperature drift of a short-circuit current of the bipolar power transistor is based upon the diode string in the fourth circuit branch.

24. The circuit according to claim 23, wherein:

the short-circuit current of the bipolar power transistor has a non-positive temperature drift.

25. The circuit according to claim 19, wherein:

the first, second and third current sources are activated by a command signal such that deactivation of the first, second and third current sources substantially eliminates current consumption in the circuit.

26. The circuit according to claim 19, wherein:

a short-circuit current level of the bipolar power transistor at relatively low voltage levels of the input supply voltage is substantially constant; and an extent of the input supply voltage for which the short-circuit current level of the bipolar power transistor is substantially constant is dependent upon a voltage appearing across the zener diode.

* * * * *

UNITED STATES PATENT AND TRADEMARK OFFICE
CERTIFICATE OF CORRECTION

PATENT NO.     : 6,259,297 B1
DATED          : July 10, 2001
INVENTOR(S)    : Giovanni Galli It is certified that error appears in the above-identified patent and that said Letters Patent is hereby corrected as shown below:

Column 7,
Line 54, replace "plurility" with -- plurality --

Signed and Sealed this

Twenty-fifth Day of February, 2003

JAMES E. ROGAN
*Director of the United States Patent and Trademark Office*